US012801287B2

(12) United States Patent
Kishikawa

(10) Patent No.: US 12,801,287 B2
(45) Date of Patent: Nov. 17, 2026

(54) MEMORY CHIP AND MEMORY SYSTEM WITH STRESS-BASED TEMPERATURE CORRECTION

(71) Applicant: Kioxia Corporation, Tokyo (JP)

(72) Inventor: Junya Kishikawa, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 19/036,989

(22) Filed: Jan. 24, 2025

(65) Prior Publication Data

US 2025/0271996 A1 Aug. 28, 2025

(30) Foreign Application Priority Data

Feb. 28, 2024 (JP) ................................ 2024-028039

(51) Int. Cl.

*G06F 3/06* (2006.01)
*H10B 80/00* (2023.01)
*H10W 90/00* (2026.01)
*H10W 90/24* (2026.01)

(52) U.S. Cl.

CPC .......... *G06F 3/0616* (2013.01); *G06F 3/0653* (2013.01); *G06F 3/0659* (2013.01); *G06F 3/0679* (2013.01); *H10B 80/00* (2023.02); *H10W 90/00* (2026.01); *H10W 90/24* (2026.01); *H10W 90/752* (2026.01)

(58) Field of Classification Search

CPC .... G06F 3/0614; G06F 3/0616; G06F 3/0634; G06F 3/0653; G06F 3/0659; G06F 3/0679; G11C 7/04; G11C 29/028; G11C 29/06; G11C 29/56; G11C 29/56016; G11C 2029/0409; H10B 80/00; H10W 90/00; H10W 90/24; H10W 90/752; H10W 90/754

See application file for complete search history.

(56) References Cited

U.S. PATENT DOCUMENTS

| | | | | |
|---|---|---|---|---|
| 2006/0238186 | A1 | 10/2006 | Nishikawa | |
| 2007/0217271 | A1* | 9/2007 | Kutz | G11C 16/30 365/189.09 |
| 2008/0094914 | A1* | 4/2008 | Park | G11C 16/349 365/185.24 |
| 2009/0091996 | A1* | 4/2009 | Chen | G11C 7/04 365/212 |
| 2010/0270659 | A1* | 10/2010 | Matsumoto | H10W 90/00 438/692 |

(Continued)

FOREIGN PATENT DOCUMENTS

| | | |
|---|---|---|
| TW | 202025326 A | 7/2020 |

*Primary Examiner* — Larry T Mackall

(74) *Attorney, Agent, or Firm* — Kim & Stewart LLP

(57) ABSTRACT

According to one embodiment, there is provided a memory chip comprising: a memory cell array; a temperature sensor configured to output first temperature data about a temperature of the memory chip; a stress sensor configured to output first stress data about a stress applied to the memory chip; a correction circuit configured to generate second temperature data about the temperature of the memory chip by correcting the first temperature data based on the first stress data; and an interface through which the second temperature data can be output to outside the memory chip.

13 Claims, 7 Drawing Sheets

(56) References Cited

U.S. PATENT DOCUMENTS

| | | | | |
|---|---|---|---|---|
| 2012/0215965 | A1* | 8/2012 | Inada | G06F 12/0246 711/E12.017 |
| 2013/0227268 | A1* | 8/2013 | Ichida | G06F 9/448 713/100 |
| 2015/0369682 | A1 | 12/2015 | Nakajima | |
| 2020/0083072 | A1 | 3/2020 | Quli | |
| 2022/0122641 | A1 | 4/2022 | Kim | |
| 2022/0187378 | A1* | 6/2022 | Formenti | G01R 31/396 |
| 2024/0004184 | A1* | 1/2024 | Haspeslagh | H10N 30/2042 |

* cited by examiner

| STRESS VALUE (a.u.) | TEMPERATURE CORRECTION VALUE (°C) |
|---|---|
| 0 | 0 |
| 1 | -0.5 |
| 2 | -1.0 |
| 3 | -1.5 |
| 4 | -2.0 |

| STRESS VALUE (a.u.) | NUMBER OF MOSFETs TO BE TURNED ON |
|---|---|
| 0 | 0 |
| 1 | 1 |
| 2 | 2 |
| 3 | 3 |
| 4 | 4 |

MEMORY CHIP AND MEMORY SYSTEM WITH STRESS-BASED TEMPERATURE CORRECTION

CROSS-REFERENCE TO RELATED APPLICATION

This application is based upon and claims the benefit of priority from Japanese Patent Application No. 2024-028039, filed Feb. 28, 2024, the entire contents of which are incorporated herein by reference. This application incorporates the entire disclosure of the base application by reference.

FIELD

Embodiments described herein relate generally to a memory chip and a memory system.

BACKGROUND

A memory system including a NAND memory as a semiconductor storage device and a memory controller that controls the semiconductor storage device is known. In recent years, high-density packaging of NAND memory has been available, and the amount of heat generated by the semiconductor storage device has increased. A temperature of the semiconductor storage device must be equal to or lower than a prescribed temperature in order to satisfy safety standards. Therefore, it is sometimes necessary to prevent an increase in the temperature. For example, a temperature sensor may be provided in the semiconductor storage device, and a temperature of the semiconductor storage device may be monitored. Then, an access to a memory may be controlled to prevent the increase in the temperature when the monitored temperature reaches a predetermined temperature threshold. In this way, a function (for example, a thermal throttling function) of preventing the increase in the temperature is provided.

DETAILED DESCRIPTION

Embodiments provide a memory chip and a memory system which highly accurately measure a temperature of a semiconductor storage device and appropriately control the temperature.

In general, according to one embodiment, there is provided a memory chip comprising: a memory cell array; a temperature sensor configured to output first temperature data about a temperature of the memory chip; a stress sensor configured to output first stress data about a stress applied to the memory chip; a correction circuit configured to generate second temperature data about the temperature of the memory chip by correcting the first temperature data based on the first stress data; and an interface through which the second temperature data can be output to outside the memory chip.

First Embodiment

Figure 1:
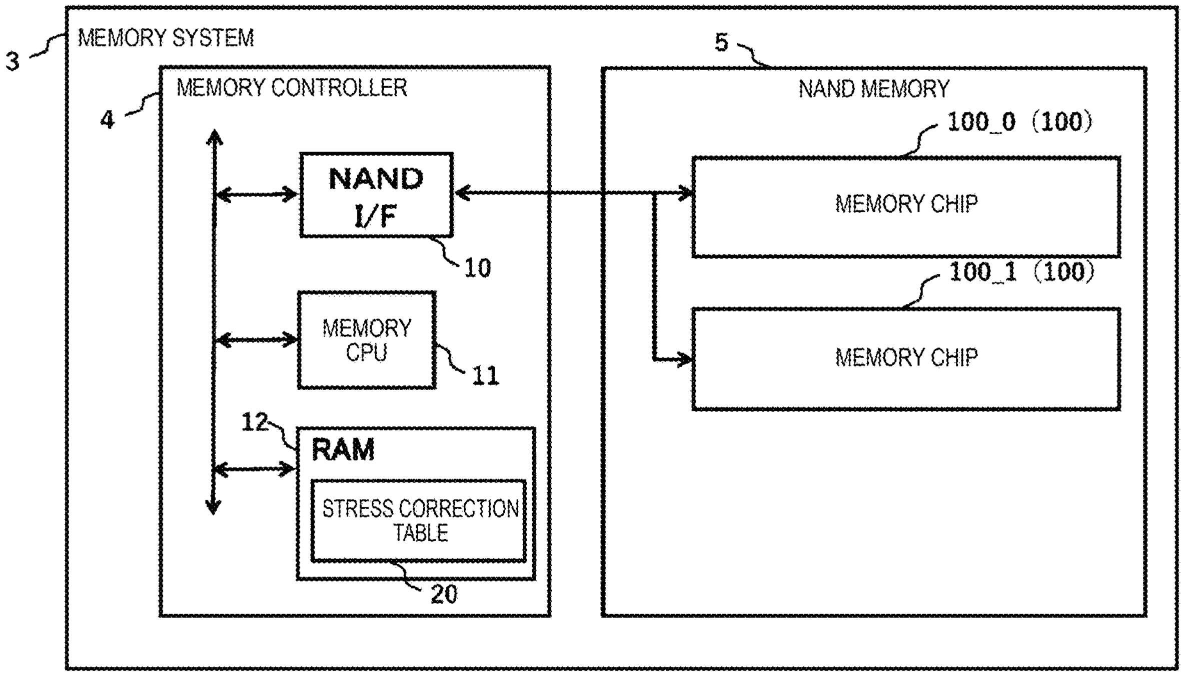
FIG. 1 is a block diagram showing an example of a configuration of a memory system according to a first embodiment.

FIG. 1 is a block diagram showing an example of a configuration of a memory system according to a first embodiment.

For example, a memory system 3 may be a storage device configured to read data from a non-volatile memory. For example, the memory system 3 may be a solid-state drive (SSD). Alternatively, the memory system may be a hard disk drive (HDD) or a memory card.

The memory system 3 includes a memory controller 4 and a non-volatile memory 5. The non-volatile memory 5 is a semiconductor storage device that stores data in a non-volatile manner. For example, the non-volatile memory 5 may be a NAND flash memory. The non-volatile memory 5 includes a plurality of blocks. Each of the plurality of blocks includes a plurality of memory cells. The block is a unit of erasing data. The block includes a plurality of pages. The page is a unit of reading and writing data. Hereinafter, the non-volatile memory 5 will be referred to as a NAND memory 5.

A memory controller 4 may be a circuit such as a system-on-a-chip (SoC). The memory controller 4 is electrically connected to the NAND memory 5 via a NAND interface (I/F) 10.

The NAND memory 5 includes one or more memory chips 100, which are referred to in the singular herein as "the memory chip 100." Each of the memory chips 100 can be independently operated. Therefore, the memory chips 100 function as units that can perform a parallel operation. Here, as an example, the NAND memory 5 includes memory chips 100_0 and 100_1 as one or more memory chips 100. The number of the memory chips 100 provided in the memory system 3 is not limited to two.

A memory CPU 11 is a processor configured to control a random-access memory (RAM) 12 and the NAND I/F 10. The memory CPU 11 can perform command processing or the like for processing various commands from a host.

The RAM 12 is a volatile memory used as a buffer for transferring data between the NAND memory 5 and the host, or a work area of the memory CPU 11.

The RAM 12 can temporarily store a stress correction table 20. The stress correction table 20 will be described later. The stress correction table 20 is stored in the memory chip 100, and is stored in the RAM 12 when necessary, as discussed further below. The stress correction table 20 may be stored in the RAM 12 after power of the memory system 3 is turned on. For example, the NAND I/F 10 may comply with a Toggle NAND flash interface and an open NAND flash interface (ONFI). The NAND I/F 10 is connected to each of the plurality of memory chips 100 in the NAND memory 5 via a plurality of channels.

In recent years, a technology for packaging much more memory chips 100 in a high-density manner in one NAND memory 5 has been progressively introduced, and in addition, miniaturization and integration of each memory chip 100 have also been advanced. The memory chip 100 internally has a boost circuit. Therefore, the amount of heat generation and power consumption of the NAND memory 5 have increased as the memory chips 100 have been packaged in the NAND memory 5 in an increasingly high-density manner. In a case where many memory chips 100 are stacked and packaged, there is a possibility that the amount of heat generation significantly increases at a specific location in the NAND memory 5.

Therefore, in the memory system 3, when the temperature of the NAND memory 5 increases, in order to prevent a failure of the NAND memory 5, a control is performed for preventing the increase in the temperature by reducing a processing speed of the NAND memory 5. For example, the memory system 3 may be provided with a function (hereinafter, referred to as "thermal throttling") of monitoring the temperature by using a temperature sensor provided in the memory chip 100, and preventing the increase in the temperature by reducing the processing speed when the monitored temperature reaches a predetermined temperature threshold.

When the temperature of the NAND memory 5 is lower than a predetermined temperature, the NAND memory 5 is controlled in a mode in which the NAND memory 5 is operated at a predetermined processing speed. When the temperature of the NAND memory 5 reaches the predetermined temperature threshold, the process proceeds to a mode in which the processing speed of the NAND memory 5 is gradually reduced by using the thermal throttling, and the temperature of the NAND memory 5 is decreased. For example, an upper limit of the temperature at which the NAND memory 5 can operate at the predetermined processing speed may be approximately 85° C.

Figure 2:
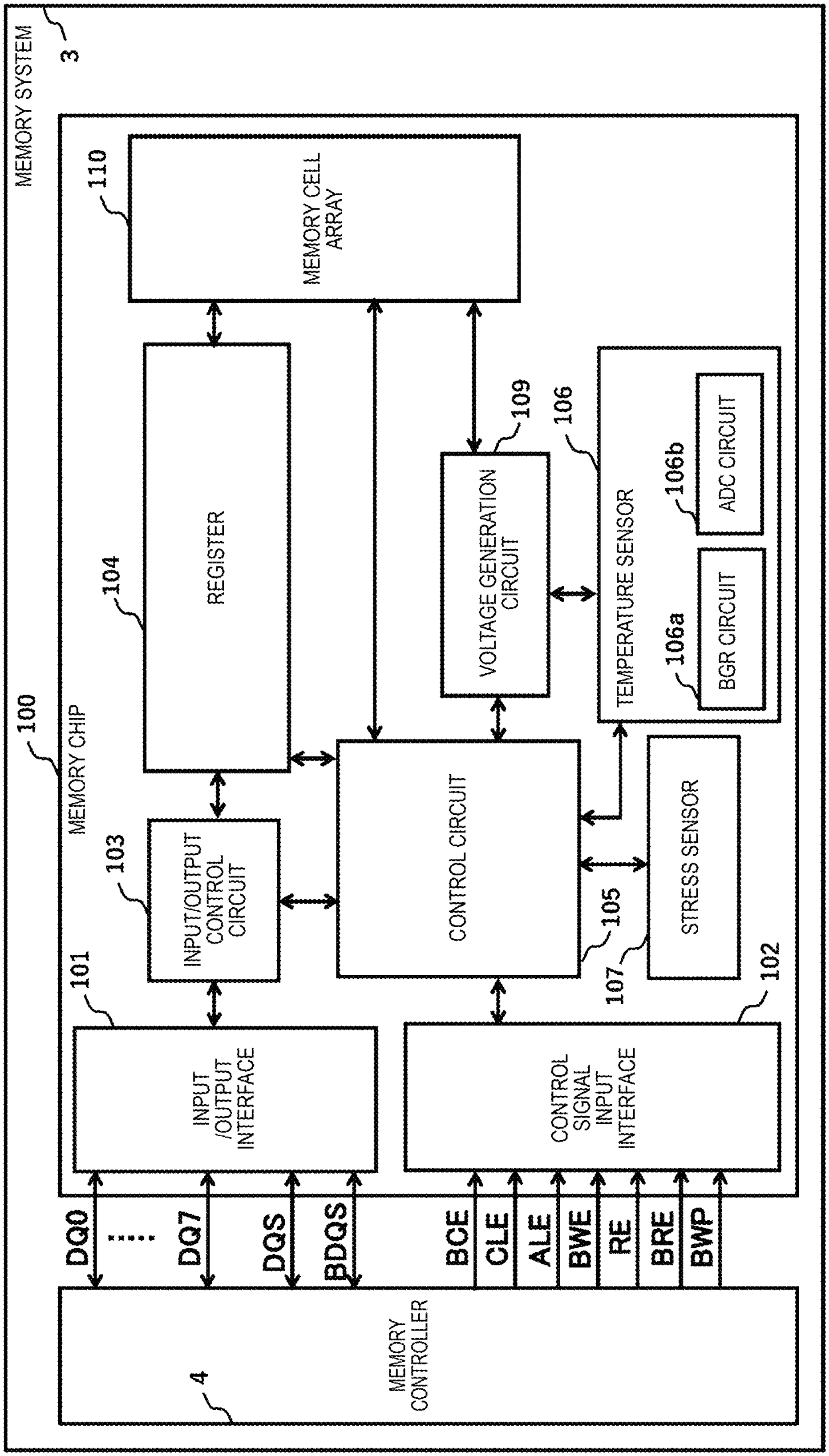
FIG. 2 is a block diagram showing an example of a configuration of a memory chip provided in the memory system according to the first embodiment.

FIG. 2 is a block diagram showing an example of a configuration of the memory system 3. In FIG. 2, a configuration of the memory chip 100 will be mainly described.

The memory controller 4 outputs a command or the like required for the operation of the memory chip 100 to the memory chip 100. The memory controller 4 outputs the command to the memory chip 100 to read data from the memory chip 100, to write data to the memory chip 100, to erase data from the memory chip 100, or the like.

The memory controller 4 and the memory chip 100 are connected via an input/output I/F 101 and a control signal input I/F 102.

The input/output I/F 101 generates data strobe signals DQS and BDQS (complementary of DQS) in accordance with a signal supplied from an input/output control circuit 103. The input/output I/F 101 outputs the data strobe signals DQS and BDQS when data is output from data input/output lines (DQ0 to DQ7). The memory controller 4 receives data from the data input/output lines (DQ0 to DQ7) in conjunction with a timing of the data strobe signals DQS and BDQS. For example, the input/output I/F 101 may include a command input terminal, an address input terminal, and the like.

The control signal input I/F 102 receives a chip enable signal BCE, a command latch enable signal CLE, an address latch enable signal ALE, a write enable signal BWE, read enable signals RE and BRE (complementary of RE), and a write protect signal BWP from the memory controller 4.

The input/output control circuit 103 outputs the data read from a memory cell array 110 to the memory controller 4 via the input/output I/F 101. The input/output control circuit 103 receives various commands, addresses, and write data such as for writing, reading, erasing, and status reading via the control signal input I/F 102 and a control circuit 105.

The control circuit 105 supplies the control signal input via the control signal input I/F 102 to the input/output control circuit 103. The control circuit 105 controls a register 104, a temperature sensor 106, a stress sensor 107, a voltage generation circuit 109, the memory cell array 110, and the like.

The input/output control circuit 103 and the control circuit 105 are described herein as having distinct functions. However, the input/output control circuit 103 and the control circuit 105 may be implemented using the same hardware resource.

The register 104 outputs a command input from the input/output control circuit 103 to the control circuit 105. For example, the register 104 may latch an address supplied from the memory controller 4. The register 104 converts the latched address into an internal physical address.

The register 104 may notify devices outside the memory chip 100 of various states in the memory chip 100. The register 104 includes a ready/busy register (not shown) that stores data indicating whether the memory chip 100 is in a ready state or busy state, and a write status register (not shown) that stores data indicating whether a write operation has succeeded or failed.

The temperature sensor 106 measures the temperature of the memory chip 100. For example, the temperature sensor 106 may include a bandgap reference circuit (BGR circuit) 106*a* and an analog-to-digital conversion circuit (ADC circuit) 106*b*.

For example, the BGR circuit 106*a* may be a circuit including a diode or the like. When the BGR circuit 106*a* receives an enable signal EN in an "H (High)" level from the control circuit 105, the BGR circuit 106*a* measures the temperature of the memory chip 100. As used herein, the "temperature of the memory chip 100" may refer to the temperature of the temperature sensor 106 or the temperature around the temperature sensor 106. The BGR circuit 106*a* measures the temperature of the memory chip 100 by using a bandgap voltage, and outputs a voltage Vtemp proportional to the temperature of the memory chip 100. The BGR circuit 106*a* generates Vtemp, and also generates a reference voltage VREF which does not depend on the temperature of the memory chip 100.

The ADC circuit 106*b* outputs a temperature code, based on Vtemp and VREF. The temperature code is digital data indicating the temperature of the memory chip 100. The temperature code is indicated by a plurality of bits of data. The temperature sensor 106 can output the generated temperature code to the control circuit 105.

A ground voltage and a power supply voltage are supplied to the voltage generation circuit 109 from outside the memory chip 100. The voltage generation circuit 109 generates various voltages based on the temperature code and applies the various voltages to the memory cell array 110 when data is erased from the memory cell array 110, when data is written to the memory cell array 110, and when data is read from the memory cell array 110.

The voltage generation circuit 109 can change various voltages applied to the memory cell array 110 in accordance with the temperature of the memory cell array 110. For example, a threshold voltage of a memory cell in the memory cell array 110 may vary depending on the temperature. Therefore, for example, in a data reading operation, the voltage generation circuit 109 may generate a voltage to be applied to a word line of the memory cell in conjunction with temperature characteristics of the threshold voltage of the memory cell.

The stress sensor 107 is a sensor that detects stress generated in the memory chip 100. The stress includes a distortion or a pressure generated in the memory chip 100.

For example, the stress sensor 107 may include a sensor using a piezoresistor. When the piezoresistor deforms by receiving the stress, electrical resistance thereof is changed. This effect is referred to as a piezoresistor effect. For example, when an external force is applied to a semiconductor material, a crystal lattice may be distorted, and an energy state of a valence band or a conduction band may be changed. In this manner, the number of carriers or mobility in the band is changed, and electrical conductivity or resistivity is changed. This characteristic can be utilized as a detection principle of a physical sensor such as a distortion sensor, a pressure sensor, and a stress sensor.

Figure 3:
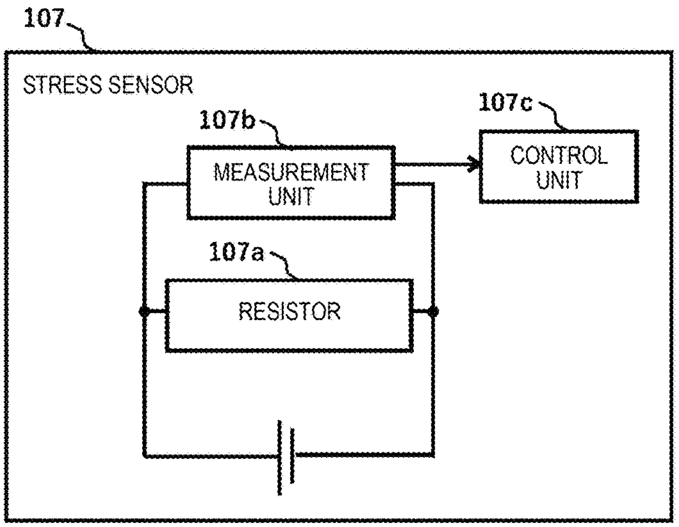
FIG. 3 is a block diagram showing an example of a configuration of a stress sensor provided in the memory system according to the first embodiment.

FIG. 3 is a diagram showing an example of the stress sensor 107. For example, the stress sensor 107 may include a resistor 107*a*, a measurement unit 107*b*, and a control unit 107*c*. The resistor 107*a* includes a piezoresistor.

When the stress sensor 107 receives the enable signal EN in the "H (High)" level from the control circuit 105, a constant current flows through the resistor 107*a*. The measurement unit 107*b* measures a voltage applied to the resistor 107*a*, and transmits the voltage applied to the resistor 107*a* to the control unit 107*c*.

The control unit 107*c* stores a reference voltage in advance. The reference voltage is a voltage applied when the current flows through the resistor 107*a* which does not receive the stress. The control unit 107*c* generates a stress value from a difference between the voltage applied to the resistor 107*a* and the reference voltage, and transmits the generated stress value to the control circuit 105.

In the first embodiment, the RAM 12 in FIG. 1 stores the stress correction table 20.

Figures 7, 8:
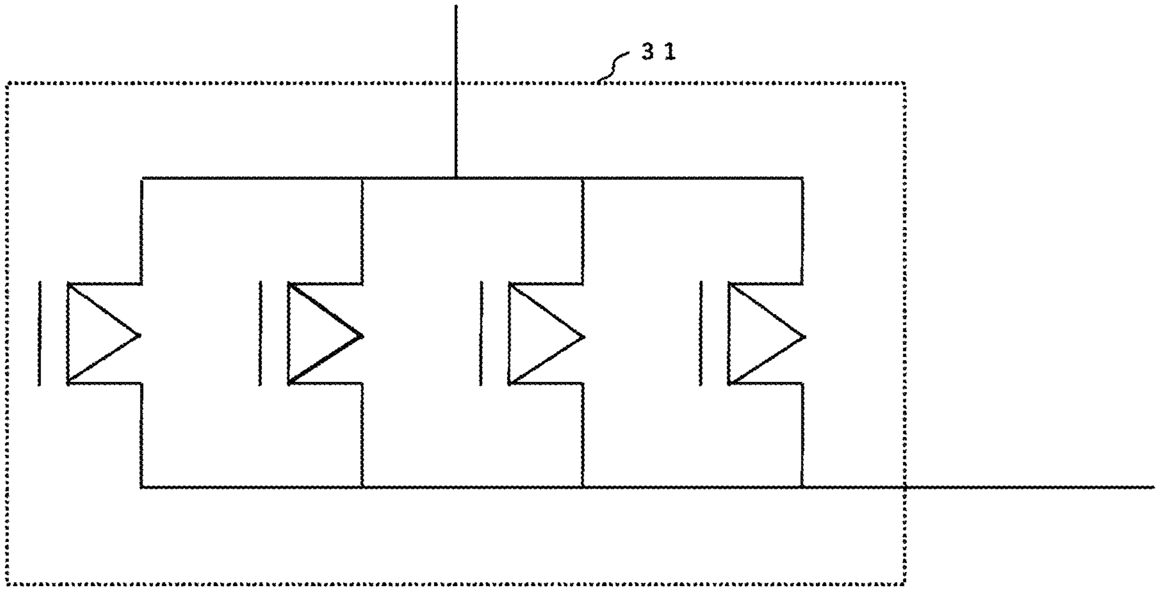
FIG. 7 is a diagram showing an example of a current adjustment circuit provided in the memory system according to the third embodiment.
FIG. 8 is a diagram showing an example of a stress correction table provided in the memory system according to embodiments.

FIG. 8 is a diagram showing an example of the stress correction table 20 according to embodiments. One column of the stress correction table 20 includes stress values indicated by the stress sensor 107 (here, the stress values are indicated in an arbitrary unit (a.u.)).

Another column of the stress correction table 20 includes temperature correction values (e.g., in ° C.). A temperature correction value is a value that may be obtained by subtracting a "true value" of the temperature of the memory chip 100 from the temperature of the memory chip 100 indicated by the temperature sensor 106. As used herein, the true value of the temperature of the memory chip 100 is the temperature that the memory chip 100 would be at a given time if the stress applied to the memory chip 100 were zero. The temperature correction value may be a positive number or a negative number.

The stress correction table 20 in FIG. 8 is an example of a table that indicates relationships between the stress values and the temperature correction values. Proper temperature correction values are input in advance to the stress correction table 20 in accordance with a usage environment of the memory chip 100. For example, to determine the proper temperature correction values, while the true temperature of the memory chip 100 is maintained to be constant, the stress applied to the memory chip 100 may be changed. In this case, a change is recorded of the temperature of the memory chip 100 which is indicated by the temperature sensor 106, and the stress correction table 20 may be prepared accordingly.

For example, proper temperature correction values may be input at an input timing of the stress correction table 20, when the memory chip 100 is manufactured. Proper temperature correction values may be input after a memory package is completed.

In the stress correction table 20, it is indicated that the temperature correction value becomes larger in a negative direction as the stress value increases, thus indicating decreasing accuracy of the temperature sensor 106. In particular, at a given temperature indicated by the temperature sensor 106, it is indicated that the true value of the temperature of the memory chip 100 increases as the stress actually generated in the memory chip 100 increases.

For example, the stress correction table 20 may be stored in the memory cell array 110 in the memory chip 100. The stress correction table 20 is stored in the RAM 12 when necessary, as discussed further below. The stress correction table 20 may be stored in the RAM 12 when power of the memory system 3 is turned on.

Here, in the first embodiment, a procedure will be described in which the memory CPU 11 acquires the true value of the temperature of the memory chip 100.

The memory CPU 11 transmits a command for requesting a temperature code to the control circuit 105. The control circuit 105 receives the command for requesting the temperature code from the memory CPU 11, and transmits the command for requesting the temperature code to the temperature sensor 106. The temperature sensor 106 receives the command from the control circuit 105, transmits the temperature code to the control circuit 105, and the control circuit 105 transmits the temperature code to the memory controller 4. The temperature code includes the temperature of the memory chip 100 which is measured by the temperature sensor 106.

The memory CPU 11 transmits a command for requesting a stress value to the control circuit 105. The control circuit 105 receives the command for requesting the stress value from the memory CPU 11, and transmits the command for requesting the stress value to the stress sensor 107. The stress sensor 107 receives the command from the control circuit 105, transmits a signal including the stress value to the control circuit 105, and the control circuit 105 transmits the signal including the stress value to the memory controller 4.

The memory CPU 11 transmits a command for requesting the stress correction table 20 to the control circuit 105. The control circuit 105 reads the stress correction table 20 stored in the memory cell array 110, and transmits the stress correction table 20 to the memory controller 4. The memory CPU 11 stores the stress correction table 20 in the RAM 12.

The memory CPU 11 may execute any one of the command for requesting the temperature code, the command for requesting the stress value, and the command for requesting the stress correction table 20 in advance, e.g., of determining to check the temperature of the memory chip 100, or may execute all the commands at the time of determining to check the temperature.

The memory CPU 11 refers to the stress value and the stress correction table 20 to obtain the temperature correction value, which corresponds to the stress value. The memory CPU 11 refers to the temperature of the memory chip 100 measured by the temperature sensor 106 and the temperature correction value to obtain the true value of the temperature of the memory chip 100. In this way, the memory CPU 11 generates the true value of the temperature of the memory chip 100 by correcting the temperature of the memory chip 100 measured by the temperature sensor 106, based on the stress value.

For example, the memory controller 4 may perform the thermal throttling by using the true value of the temperature of the memory chip 100. When the true value of the memory chip 100 is lower than the predetermined temperature, the memory CPU 11 may control the memory chip 100 in the mode in which the memory chip 100 is operated at the predetermined processing speed. When the true value of the memory chip 100 is greater than or equal to the predetermined temperature, the memory CPU 11 may control the memory chip 100 in the mode in which the processing speed of the memory chip 100 is gradually reduced by using the thermal throttling, and temperature of the memory chip 100 is decreased.

In a memory system having no stress sensor, when the stress applied to the memory chip is high, a temperature sensor experiencing the high stress outputs a temperature which is lower than the true value of the temperature of the memory chip. For example, even when the true value of the temperature of the memory chip is 85° C., when the stress is high, the temperature sensor may output a temperature which is lower than 85° C., the thermal throttling may not function, and the memory chip may continue being controlled without lowering the processing speed. In some cases, a lifetime of the memory chip may be shortened because the memory chip is operated at a processing speed that is too high for the temperature.

According to embodiments, the memory controller 4 can control the memory system 3 by using a temperature that is corrected based on the stress correction table 20. Specifically, when the stress applied to the memory chip 100 is high, the temperature sensor 106 outputs a temperature which is lower than the true value of the temperature of the memory chip 100. However, since the memory system 3 includes the stress sensor 107 and the stress correction table 20, the true value of the temperature of the memory chip 100 can be obtained. That is, the memory system 3 can perform the thermal throttling based on the temperature that would be output by the temperature sensor 106 if the stress applied to the memory chip 100 were zero. In this manner, the memory chip 100 can perform proper control, based on a more accurate temperature than that which is output by the temperature sensor 106.

Second Embodiment

In a second embodiment, the same reference numerals will be used for configurations that are the same as those of the first embodiment, description thereof will be omitted, and only different configurations will be described.

In the first embodiment, the stress correction table 20 is stored in the RAM 12 when necessary. Meanwhile, in the second embodiment, the stress correction table 20 is instead stored in the register 104.

Figure 4:
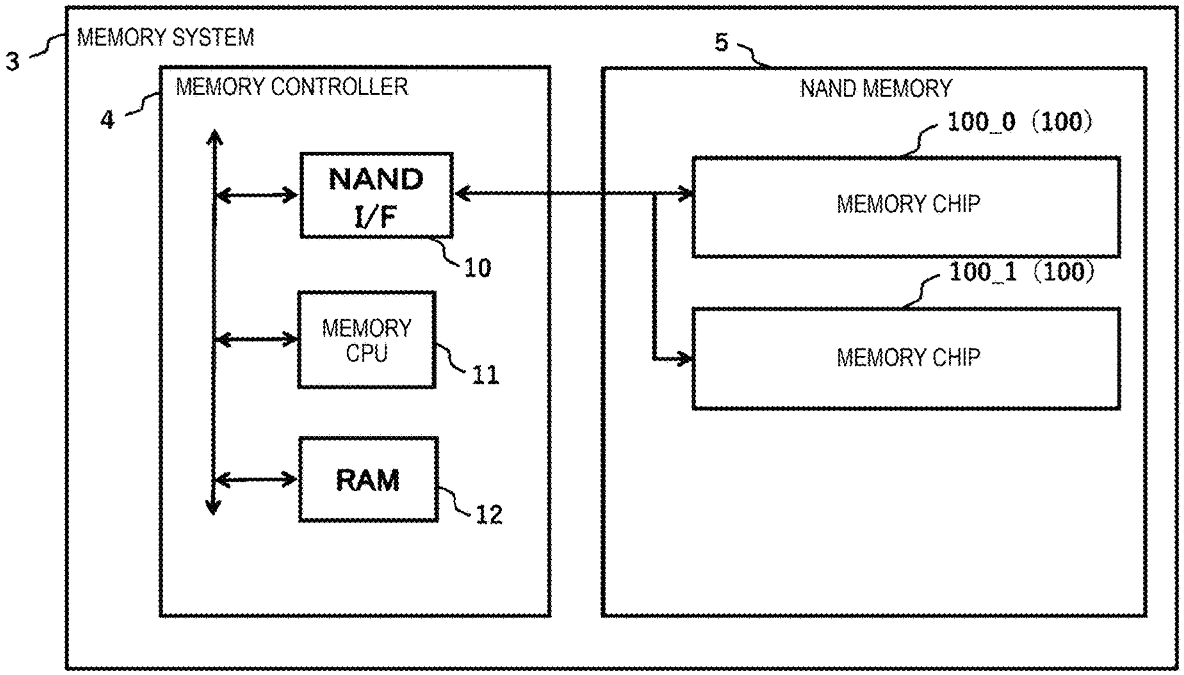
FIG. 4 is a block diagram showing an example of a configuration of a memory system according to a second embodiment.

FIG. 4 is a block diagram showing an example of an internal configuration of the memory system 3 according to the second embodiment. The RAM 12 of the second embodiment does not store the stress correction table 20.

Figure 5:
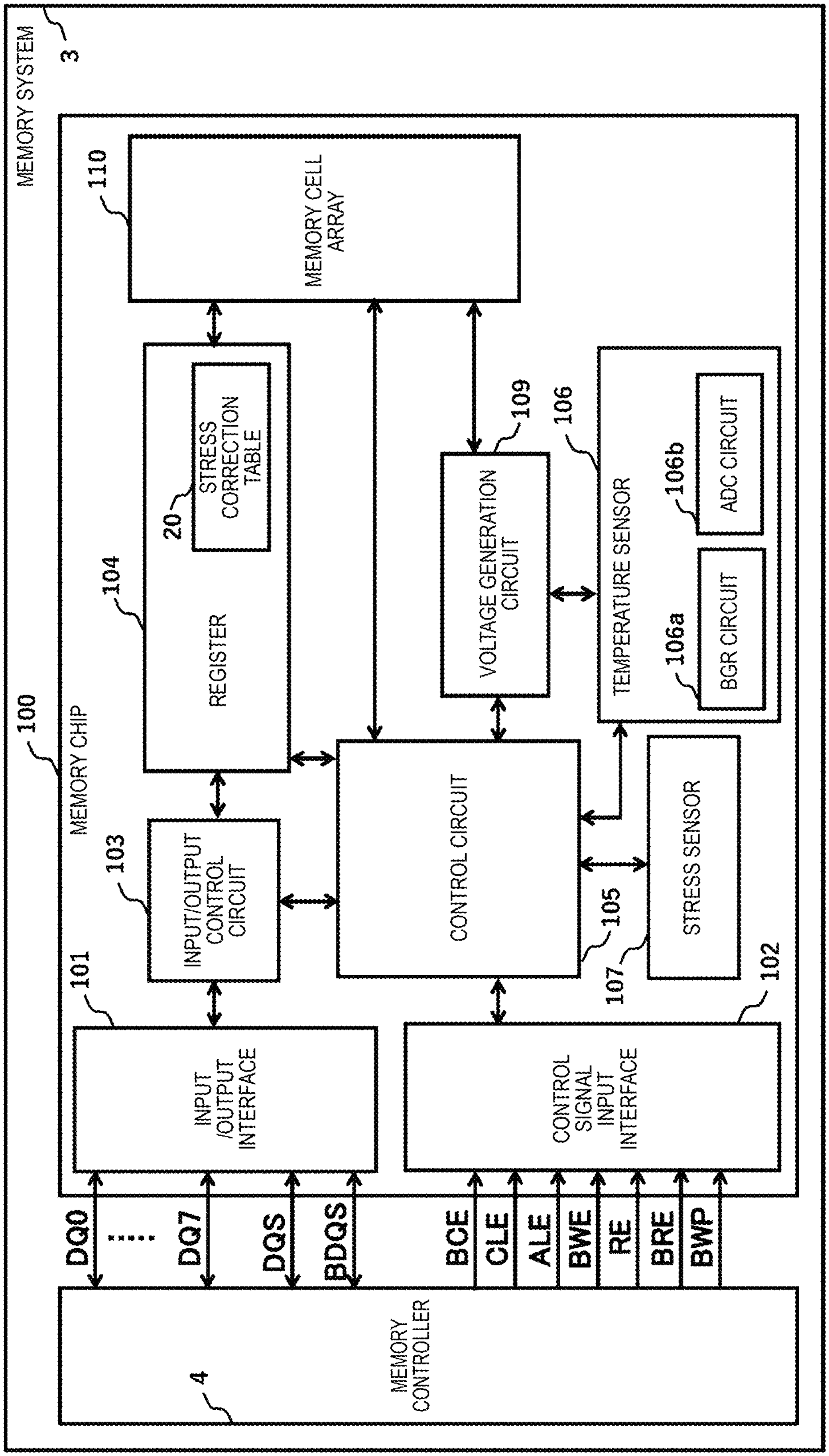
FIG. 5 is a block diagram showing an example of a configuration of a memory chip provided in the memory system according to the second embodiment.

FIG. 5 is a block diagram showing an example of an internal structure of the memory chip 100 according to the second embodiment.

The control circuit 105 acquires the temperature code from the temperature sensor 106, and stores the temperature code in the register 104. The control circuit 105 acquires the stress value from the stress sensor 107, and stores the stress value in the register 104.

The register 104 stores the stress correction table 20 after power is turned on. Before the power is turned on, the stress correction table 20 is stored in the memory cell array 110, and is stored in the register 104 when necessary, as discussed further below.

Here, in the second embodiment, a procedure will be described in which the memory controller 4 acquires the true value of the temperature of the memory chip 100.

The memory CPU 11 requests the control circuit 105 to transmit the temperature of the memory chip 100.

The control circuit 105 receives the command for requesting the temperature of the memory chip 100 from the memory CPU 11, and transmits a command for requesting the temperature code to the temperature sensor 106. The temperature sensor 106 receives the command from the control circuit 105, and transmits the temperature code to the control circuit 105. The temperature code includes the temperature of the memory chip 100 which is measured by the temperature sensor 106.

When the control circuit 105 receives the command for requesting the temperature of the memory chip 100 from the memory CPU 11, the control circuit 105 also transmits a command for requesting the stress value to the stress sensor 107. The stress sensor 107 receives the command from the control circuit 105, and transmits the signal including the stress value to the control circuit 105.

When the control circuit 105 receives the command for requesting the temperature of the memory chip 100 from the memory CPU 11, the control circuit 105 also reads the stress correction table 20 stored in the memory cell array 110, and stores the stress correction table 20 in the register 104.

The control circuit 105 may perform the command for requesting the temperature code, the command for requesting the stress value, or the reading of the stress correction table 20 in advance, e.g., of determining to check the temperature of the memory chip 100, or may perform each at the time of determining to check the temperature.

The control circuit 105 refers to the stress value and the stress correction table 20 to obtain the temperature correction value, which corresponds to the stress value. The control circuit 105 then refers to the temperature of the memory chip 100 measured by the temperature sensor 106 and the temperature correction value to obtain the true value of the temperature of the memory chip 100. In this way, the control circuit 105 generates the true value of the temperature of the memory chip 100 by correcting the temperature of the memory chip 100 measured by the temperature sensor 106, based on the stress value.

The control circuit 105 transmits the true value of the temperature of the memory chip 100 to the memory controller 4. The memory CPU 11 may refer to the true value of the temperature of the memory chip 100, and may perform the thermal throttling, for example. When the true value of the memory chip 100 is lower than the predetermined temperature, the memory CPU 11 may control the memory chip 100 in the mode in which the memory chip 100 is operated at the predetermined processing speed. When the true value of the memory chip 100 is greater than or equal to the predetermined temperature, the memory CPU 11 may control the memory chip 100 in the mode in which the processing speed of the memory chip 100 is gradually reduced by using the thermal throttling, and temperature of the memory chip 100 is decreased.

The control circuit 105 generates a temperature code including the true value of the temperature of the memory chip 100 after obtaining the true value of the temperature of the memory chip 100, and supplies the temperature code to the voltage generation circuit 109. The voltage generation circuit 109 generates various voltages, based on the temperature code including the true value of the temperature of the memory chip 100.

The memory controller 4 according to the second embodiment can receive the true value of the temperature of the memory chip 100 by requesting the control circuit 105 to transmit the temperature of the memory chip 100. That is, the memory controller 4 can acquire the true value of the temperature of the memory chip 100 without correcting the temperature.

In addition, in the second embodiment, the voltage generation circuit 109 can generate various voltages, based on the true value of the temperature of the memory chip 100. In this manner, the voltage generation circuit 109 can set the voltage to be applied to various circuits of the memory chip 100 by using the true value of the temperature of the memory chip 100. Specifically, various voltages used when data is erased, data is written, and data is read can be set by using the true value of the temperature of the memory chip 100, and can be applied to the various circuits of the memory chip 100. As a result, the memory chip 100 can be controlled by a voltage which is suitable for the temperature of the memory chip 100, e.g., to decrease the processing speed of the memory chip 100 when the temperature of the memory chip 100 becomes greater than a predetermined temperature, or to increase the processing speed of the memory chip 100 when the temperature of the memory chip 100 becomes less than a predetermined temperature.

Third Embodiment

In a third embodiment, the same reference numerals will be used for configurations that are the same as those of the first embodiment and the second embodiment, description thereof will be omitted, and only different configurations will be described.

Figure 6:
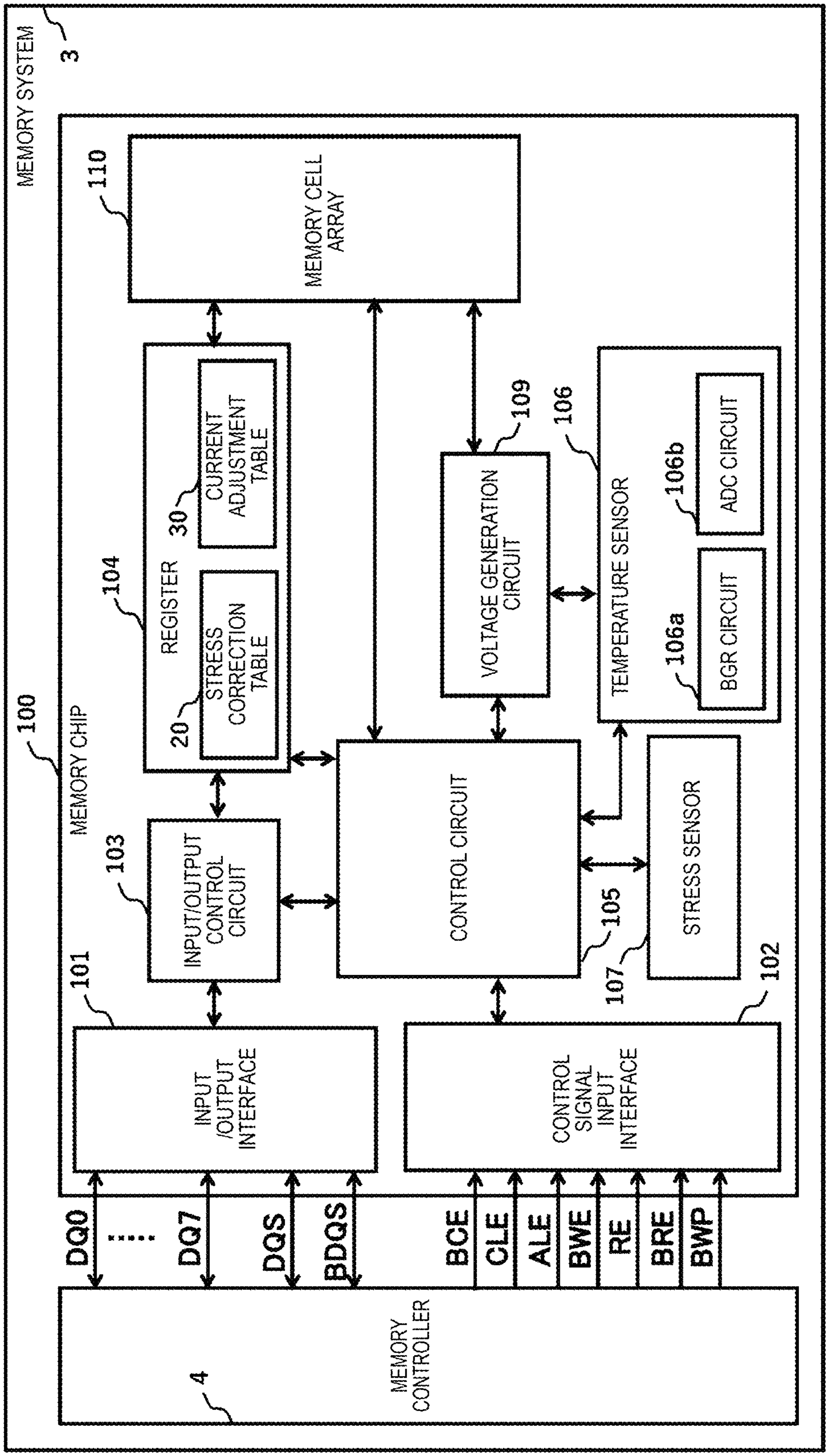
FIG. 6 is a block diagram showing an example of a configuration of a memory chip provided in a memory system according to a third embodiment.

FIG. 6 is a block diagram showing an example of an internal structure of the memory chip 100 according to the third embodiment.

The register 104 further stores a current adjustment table 30 after power is turned on. Before the power is turned on, the current adjustment table 30 is stored in the memory cell array 110, and is stored in the register 104 when necessary, as discussed further below.

In the third embodiment, the memory chip 100 further includes a current adjustment circuit 31 (shown in FIG. 7). For example, the memory chip 100 may include a control circuit 105, an input/output control circuit 103, and the like, but the memory chip 100 is not limited thereto. Each of the circuits in the memory chip 100 may include the current adjustment circuit 31, or only one of the circuits may include the current adjustment circuit 31. For each circuit that includes the current adjustment circuit 31, the current adjustment circuit 31 is connected to one end of the circuit. The current adjustment circuit 31 changes an amperage of a current, and the resulting current flows into the circuit via the current adjustment circuit 31, i.e., the current adjustment circuit 31 changes the amperage of the current flowing into the circuit.

FIG. 7 is a diagram showing an example of the current adjustment circuit 31. The current adjustment circuit 31 includes a parallel circuit of a plurality of metal-oxide-semiconductor field-effect transistors (MOSFETs). Although FIG. 7 shows an example in which four MOSFETs are connected in parallel, the number of MOSFETs provided in the current adjustment circuit 31 is not limited to four. The MOSFETs provided in the current adjustment circuit 31 can be individually switched on and off. In the current adjustment circuit 31, the number of the MOSFETs to be turned on is controlled by the control circuit 105.

Figures 9, 10:
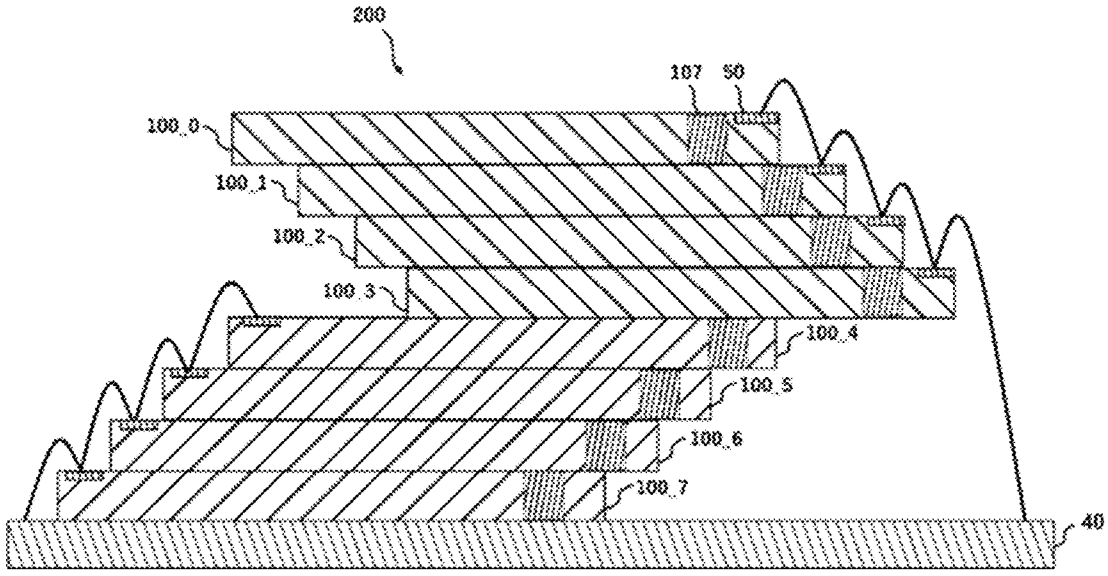
FIG. 9 is a diagram showing an example of a current adjustment table provided in the memory system according to the third embodiment.
FIG. 10 is a cross-sectional view showing an example of an internal configuration of a memory package according to embodiments.

FIG. 9 is a diagram showing an example of the current adjustment table 30 according to the third embodiment. One column of the current adjustment table 30 includes stress values indicated by the stress sensor 107. Another column of the current adjustment table 30 indicates the number of the MOSFETs to be turned on in the current adjustment circuit 31.

The current adjustment table 30 shows a relationship between the stress value and the number of the MOSFETs to be turned on. The current adjustment table 30 shows that the number of MOSFETs to be turned on increases as the stress value increases. As a result, as the stress value increases, a resistance value of the current adjustment circuit 31 is reduced.

The number of the MOSFETs to be turned on is input in advance to the current adjustment table 30 in accordance with a usage environment of the memory chip 100. For example, the number of MOSFETs to be turned on may be input when the memory chip 100 is manufactured. The number of the MOSFETs to be turned on may be input after the memory package is completed. The number of the MOSFETs to be individually turned on may be input to the current adjustment table 30 in accordance with a circuit in the memory chip 100 connected to the current adjustment circuit 31.

Here, in the third embodiment, a procedure in which the control circuit 105 acquires the stress value of the memory chip 100 and controls the current adjustment circuit 31 will be described.

The control circuit 105 transmits a command for requesting the stress value to the stress sensor 107. The stress sensor 107 receives the command from the control circuit 105, and transmits the signal including the stress value to the control circuit 105.

The control circuit 105 reads the current adjustment table 30 stored in the memory cell array 110, and stores the current adjustment table 30 in the register 104.

The control circuit 105 may perform any of the command for requesting the stress value and reading the current adjustment table 30 in advance, e.g., of determining to check the temperature of the memory chip 100, or may perform each at the time of determining to check the temperature.

The control circuit 105 refers to the current adjustment table 30 and the stress value to obtain the number of the MOSFETs to be turned on, which corresponds to the stress value.

The control circuit 105 turns on only a proper number of the MOSFETs provided in the current adjustment circuit 31, based on the value read from the current adjustment table 30.

A memory system having no current adjustment circuit will now be described. The resistance value of a circuit in the memory chip is changed depending on the temperature of the memory chip. Therefore, the voltage applied to the circuit in the memory chip is controlled in association with the temperature of the memory chip. However, when the stress applied to the memory chip is high, a lower voltage is applied to the circuit than the voltage when there is no stress, and a lower current flows than the current when there is no stress.

In the third embodiment, the current flowing into circuits of the memory chip 100 can be controlled in accordance with the stress applied to the memory chip 100. Specifically, as the stress value increases, a lower voltage is applied to the circuit than a reference, and at the same time, the resistance value of the current adjustment circuit 31 is reduced. Therefore, a proper current value can flow through the circuit in the memory chip 100.

Configuration of Memory Package

FIG. 10 is a cross-sectional view showing an example of an internal configuration of the memory package according to embodiments. The memory package includes a package substrate 40 and eight memory chips 100 (100_0 to 100_7). For example, the plurality of memory chips 100 may be sealed with a mold resin (not shown) on the package substrate 40. In FIG. 10, the memory controller 4 shown in FIG. 1 is omitted in the drawing. Although the eight memory chips 100 are stacked, the number of the memory chips 100 is not limited to eight, and can be appropriately changed. Each memory chip 100 includes a terminal 50 for transmitting and receiving signals to and from the outside (to and from the memory controller 4 or the like).

The memory chips 100_0 to 100_7 are sequentially stacked from a lower side on an upper surface of the package substrate 40 to expose the terminal 50, for example in a state where the centers of the memory chips are shifted in a stepwise manner. The terminal 50 of each memory chip 100 may be electrically connected to the package substrate 40 by a gold wire, for example.

The memory chip 100 in FIGS. 2, 5, and 6 may be any one of the memory chips 100_0 to 100_7, or may be considered to correspond to all of the memory chips 100_0 to 100_7.

Each memory chip 100 includes the stress sensor 107. The stress sensor 107 may be manufactured together with the memory cell array 110, the control circuit 105, or the like, and may be integrated on the package substrate 40. The stress sensor 107 may also be packaged in the memory chip 100 in a form of being incorporated in the package substrate 40.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory chip comprising:
- a memory cell array;
- a temperature sensor configured to output first temperature data about a temperature of the memory chip;
- a stress sensor configured to output first stress data about a stress applied to the memory chip;
- a correction circuit configured to generate second temperature data about the temperature of the memory chip by correcting the first temperature data based on the first stress data;
- an interface through which the second temperature data can be output to outside the memory chip; and
- a current adjustment circuit including a plurality of transistors that are connected in parallel and configured to adjust an amperage of a circuit of the memory chip that is connected to the current adjustment circuit,
- wherein the correction circuit is further configured to use the first stress data to control a resistance value of the current adjustment circuit to adjust the amperage of the circuit of the memory chip that is connected to the current adjustment circuit.

2. The memory chip according to claim 1, further comprising:
- a stress correction table including information for correcting the first temperature data to the second temperature data based on the first stress data,
- wherein the correction circuit generates the second temperature data using the first stress data and the stress correction table.

3. The memory chip according to claim 2, further comprising:
- a register in which the stress correction table, the first temperature data, and the first stress data are stored.

4. The memory chip according to claim 1, wherein the stress sensor includes a piezoresistor, and the stress sensor outputs the first stress data using the piezoresistor.

5. The memory chip according to claim 1, wherein the memory chip is configured to operate in a first mode or in a second mode, based on control from outside the memory chip.

6. The memory chip according to claim 5, wherein in the first mode, the memory chip operates at a first processing speed, and in the second mode, the memory chip operates at a second processing speed that is slower than the first processing speed.

7. The memory chip according to claim 1, further comprising:
- a voltage generation circuit configured to generate a voltage based on the second temperature data and apply the generated voltage to the memory cell array.

8. A memory system comprising:
- a memory chip including
  - a memory cell array,
  - a temperature sensor configured to output first temperature data about a temperature of the memory chip,
  - a stress sensor configured to output first stress data about a stress applied to the memory chip,
  - a correction circuit configured to generate second temperature data about the temperature of the memory chip by correcting the first temperature data based on the first stress data, and
  - an interface through which the second temperature data can be output to outside the memory chip;
- a current adjustment circuit including a plurality of transistors that are connected in parallel and configured to adjust an amperage of a circuit of the memory system that is connected to the current adjustment circuit; and
- a memory controller including a processor configured to control writing of data to the memory cell array, reading of data from the memory cell array, or erasing of data from the memory cell array, based on the second temperature data, wherein the second temperature data is received from the memory chip through the interface, wherein the correction circuit is further configured to use the first stress data to control a resistance value of the current adjustment circuit to adjust the amperage of the circuit of the memory system that is connected to the current adjustment circuit.

9. The memory system according to claim 8, further comprising:

a stress correction table including information for correcting the first temperature data to the second temperature data based on the first stress data, wherein the correction circuit generates the second temperature data using the first stress data and the stress correction table.

10. The memory system according to claim 9, further comprising:

a register in which the stress correction table, the first temperature data, and the first stress data are stored.

11. The memory system according to claim 8, wherein the processor of the memory controller is further configured to control the memory system in a first mode or in a second mode, based on the second temperature data.

12. The memory system according to claim 11, wherein in the first mode, the processor of the memory controller controls the memory system to operate at a first processing speed, and in the second mode, the processor of the memory controller controls the memory system to operate at a second processing speed that is slower than the first processing speed.

13. The memory system according to claim 8, further comprising:

a voltage generation circuit configured to generate a voltage based on the second temperature data and apply the generated voltage to the memory cell array.

* * * * *